United States Patent [19]

Ida

[11] 4,336,461
[45] Jun. 22, 1982

[54] FAIL-SAFE APPARATUS

[75] Inventor: Edward S. Ida, Newark, Del.

[73] Assignee: E. I. Du Pont de Nemours and Company, Wilmington, Del.

[21] Appl. No.: 189,626

[22] Filed: Sep. 22, 1980

[51] Int. Cl.³ .............................................. G02B 27/00
[52] U.S. Cl. ..................................... 250/551; 307/311
[58] Field of Search ........................... 250/551, 214 R; 307/311

[56] References Cited

U.S. PATENT DOCUMENTS 3,408,507 10/1968 Martin .
3,430,066 2/1969 Marsh et al. .
3,508,078 4/1970 Komamiya et al. .
3,743,855 7/1973 Struger .
4,065,683 12/1977 Clarlie .
4,097,764 6/1978 Sibley .

OTHER PUBLICATIONS

"Design of Fail-Safe Control Systems", J. A. Bryant, *Power* pp. 52–56 Jan., 1976.

*Primary Examiner*—David C. Nelms
*Assistant Examiner*—Darwin R. Hostetter

[57] ABSTRACT

A fail-safe logic circuit which includes a pulse generator driven series arrangement of opto-isolators each of which generates a pulsating signal at its output as a function of the logic level state of its respective input terminal. If all input terminals are logic level highs, then a pulsating output signal is equivalent to a true state whereas either a DC or zero level signal is indicative of a false state.

4 Claims, 2 Drawing Figures

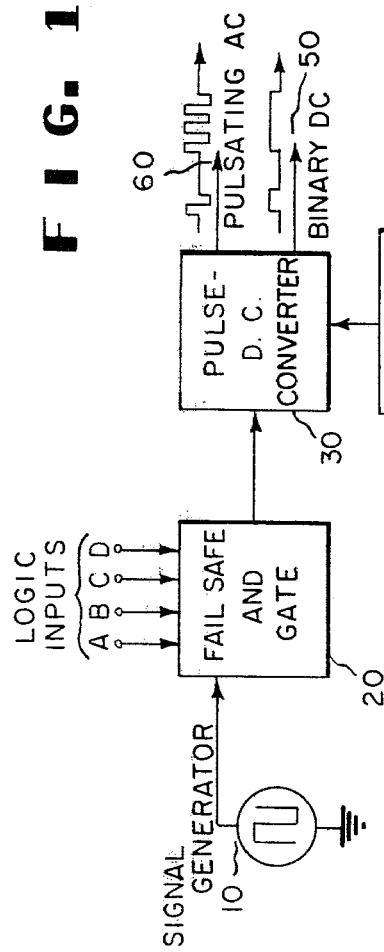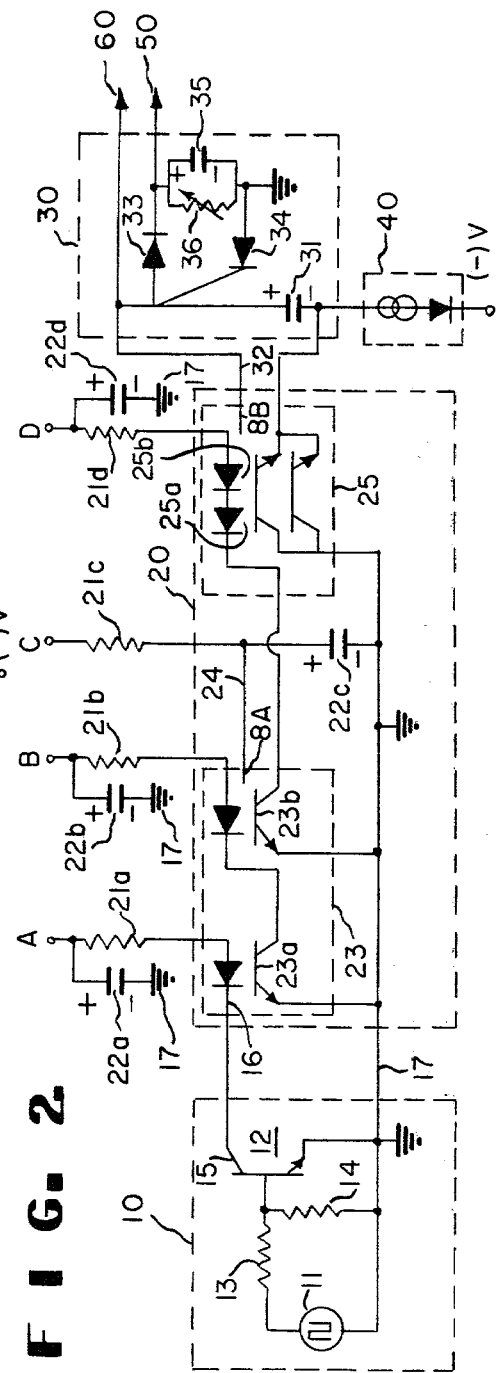

FAIL-SAFE APPARATUS

BACKGROUND OF THE INVENTION

This invention relates to a fail-safe logic circuit and more particularly to a pulsating logic AND gate for providing fail-safe operation.

In the design of fail-safe logic circuitry, it is recognized that solid state components are equally likely to fail in the ON state as in the OFF state. Not only can semi-conductor junctions electrically open circuit or short circuit with almost equal probability, but they can also "lock up" even though no catastrophic failure occurs. To minimize the impact of the above types of failures, two principles are important in fail-safe logic element design; (a) a true logic state must be equated to an "energy present" condition, and (b) inverted functions such as NOT, NOR and NAND should be avoided.

The AND gate circuit of this invention observes the foregoing principles to make its application in fail-safe digital systems such as oil and gas combustion controllers particularly attractive.

SUMMARY OF THE INVENTION

The present invention includes a pulse generator driven series arrangement of opto-isolators each of which generates a pulsating signal at its output as a function of the logic level state of its respective input terminals. If all input terminals are logic level highs, then a pulsating output signal is equivalent to a true state whereas either a DC or a zero level signal is indicative of a false state. The use of opto-isolators affords additional fail safety by isolating the effects of input and output circuit noise on the operation of the AND gate itself.

BRIEF DESCRIPTION OF THE DRAWING

FIG. 1 is a block diagram of the logic circuit of this invention.

FIG. 2 is a detailed schematic of FIG. 1.

DETAILED DESCRIPTION OF THE PREFERRED EMBODIMENT

Referring to the drawing, a signal generator 10 generates a pulsating signal for input to the enable terminal of the fail-safe AND gate 20 which comprises a serially connected array of opto-isolators, wherein each "stage" in the array is electrically isolated from its neighbors by virtue of the inherent optical coupling. The input terminals of ANd gate 20 lettered A, B, C, and D, receive DC binary logic level signals from a digital system not shown. Only when the logic signal inputs all have a logic high state, do each of the opto-isolators in the array switch on and off synchronously with the signal from signal generator 10 and cause the signal at the output terminal of AND gate 20 to pulsate similarly. A failure of any element in the array, or loss of logic signal input, will cause the output signal from AND gate 20 to assume a constant (or zero) non-oscillating DC value.

A pulse-DC converter 30, connected to the output of fail-safe AND gate 20 and powered by constant current generator 40 is used to convert the pulsating (true) and constant DC (false) logic states into logic high (true) and logic low (false) equivalents at output terminal 50. Converter 30 can also provide pulsating (true) and zero (false) logic output signals at terminal 60, as illustrated by the waveforms shown.

Signal generator 10 comprises an oscillator 11, typically 1 kHz which drives transistor 12, typically a commercially available Motorola Corporation type 2N2218, via a voltage divider network comprising 100 Kohm and 10 Kohm resistors 13 and 14 respectively. Preferably, the oscillator frequency is selected so as to not only simplify the filtering means needed but also to distinguish it from power line frequency. The transistor 12 is used as a coupling element not only to reduce oscillator loading but also to minimize AC noise current flows in the succeeding AND gate circuit 20. Specifically, the collector 15 of the transistor 12 is connected to the cathode terminal 16 of opto-isolator 23a to provide a switched high impedance path to circuit common 17 for the current through the LED element.

Fail-safe AND gate circuit 20 comprises two dual-channel isolators 23, 25 typically Hewlett-Packard Company HCPL-2731 types, which are serially connected to provide electrical isolation for each of the four logic input terminals lettered A through D. The logic voltage inputs, which may range between (+)6.6 volts and (+)15 volts DC for the true state, provide sufficient current flow through the associated LED's to maintain the individual opto-isolator current gains above unity. With a 50% duty cycle of oscillator 11 excitation, the peak LED currents are at least 0.5 ma for logic inputs A, B and C but are doubled in the case of input D of opto-isolator 25 since opto-isolator 25 is operated in parallel transistor configuration to provide a conservative design margin for current gain.

A low pass filter network, comprising 8.2 Kohm resistor 21a and 2.2 mfd capacitor 22a, is connected to input terminal A. Its purpose is to provide buffering for the logic signal source to significantly reduce the effect of pulsations due to the switching operation of AND gate 20. The remaining input terminals B, C, and D are similarly protected with respective resistors 21b, 21c and 21d and capacitors 22b, 22c and 22d. Note that since bias lines 24 and 32 each control a diode detector (not shown) in respective dual opto-isolator units 23, 25 (at input terminals 8a and 8b), these lines may be used to handle additional logic input signals while still providing its design function of reducing distortion in the gate output signal.

Although only four opto-isolators (in two dual isolator packages) are shown in FIG. 2, the number of logic signal input opto-isolator stages can be extended indefinitely, since each stage has a current gain above unity. However, one must be careful to use adequately high frequency-responsive opto-isolators to preserve the fidelity of the output signal waveform.

In operation, the constant switching action of the gate 20 output signal causes capacitor 31 to charge-up through diode 34, then discharge through diode 33 into capacitance 35. This "charge-pump" action makes a (+) plus output signal available, even though only a (−) negative power source supplies pulse-DC converter stage 30. This is a major factor in its fail-safe design. The measured output load capability of this circuit is 9.0 volts with a 1.5 Kohm load and 6.6 volt logic input signal, whereas with 4.0 volt input logic signals, the output falls to 8.0 volts. With light loading conditions, input logic signal level thresholds are found to be between 2.5 volts and 3.0 volts which still provides consistent gate operation.

The output of dual opto-isolator 25 operates against the current flow produced by constant current generator 40, which in turn is driven by a (−) 15 volt supply. Constant current generator 40 may comprise a diode typically a National Semiconductor Company NSL 4944 type which functions both as an output indicator lamp and a constant current regulator to filter ripple and line noise from the (−) 15 volt supply. An alternative configuration might comprise a separate LED to serve as an output indicator in combination with a constant current diode such as a National Semiconductor Company LM234 which is adjustable and rated to 40 volts.

The circuitry of this invention includes several safeguards to limit carry-over of 120 Hz ripple to the succeeding circuitry. In the event of a dual fault comprising, a shorting of the diode in current generator 40 plus loss of filtering on the −15 volt supply, the 120 Hz ripple would then alternately charge and discharge capacitor 31 in pulse-DC converter circuit 30. This is as typically 4.7 mfd and joins the logic signal output from AND gate 20 to the output of constant current generator 40 to produce the pulsating AC logic output signal 60, or via diode 33, to produce a binary DC logic output signal 50. Since the line ripple frequency is only about 10% of the designed frequency, the load carrying capability of output signals 60 and 50 would be similarly reduced and should still remain safe, provided there is an adequate load at the output terminals of pulse-DC converter 30 to discharge capacitor 35 with a predetermined time constant typically 0.1 seconds. As a further safeguard, the presence of AC ripple could cause the voltage on bias line 32 to fall below that needed to maintain dual opto-isolator 25 in its enabled state and thus terminate the logic level pulsations. The provision of redundant filtering at the output terminal of the −15 V supply may be needed as well.

Diodes 33 and 34, typically commercially available General Electric Company type IN914's, serve to rectify the pulsating AC signal 60 to generate binary DC signal 50. The parallel filter network of capacitance 35, typically 4.7 mfd, and resistance element 36, having selective values of 8.2 Kohm and 4.1 Kohm span series connected diodes 33 and 34, respectively. This filter characteristic is selected to provide a sufficiently rapid decay characteristic to dissipate the charge stored by capacitor 35 when pulse-DC converter 30 is lightly loaded by succeeding circuitry. In those cases where the succeeding circuitry has filtering at the input terminals similar to that provided for terminals A, B, C, and D of the instant invention, the capacitor 35-resistance 36 network is not needed.

The fail-safe design of this AND gate system takes into account the following factors:
- Power supply noise or loss of regulation or filtering
- A flow of power through either input of output terminals upon failure of any circuit element
- Noisy logic input signals
- Opens or grounds
- Two or three simultaneous component failures must occur before an unsafe output will result. A single component failure results in a loss of output energy
- Energy flow out of an input terminal is prevented, thus eliminating the feeding of false signals to networks tied in parallel to the input terminals of the AND gate
- Self-oscillation
- Loss of system oscillator
- Improper frequency or phase.

I claim:

1. A fail-safe circuit comprising:
   (a) a first opto-isolator having a gain of at least unity and having input switching element, output switching element and input LED element terminals;
   (b) a second opto-isolator having a gain of at least unity and having input switching element, output switching element and input LED element terminals, said input LED element terminal of said second opto-isolator being connected to the output switching element terminal of said first opto-isolator;
   (c) a pulsating signal source connected to the input LED element terminal of said first opto-isolator;
   (d) means for simultaneously applying a DC high binary logic level signal to the input switching element terminals of said first and second opto-isolator whereby a pulsating logic signal is generated at the output switching element terminal of said second opto-isolator.

2. The circuit of claim 1, wherein the pulsating logic signal at the output switching element terminal of the second opto-isolator is input to a fail-safe pulse to DC converter.

3. The circuit of claim 2, wherein said fail-safe pulse to DC converter, comprises:
   (a) a third opto-isolator haing its LED element connected between a DC voltage supply and the output terminal of said second opto-isolator, its one switching element terminal connected to circuit common, and its other switching element terminal generating an amplified pulsating signal in phase with said output pulsating logic signal from said second opto-isolator; an input capacitor with one terminal joining said other switching element terminal of said third opto-isolator; a constant current generator connected to the junction of said input capacitor and said third opto-isolator for maintaining a positive polarity signal at the other terminal of said input capacitor using a negative DC voltage supply;
   (b) first and second diodes in series connection with the anode of the first joining the cathode of the second and said diode junction connected to the other terminal of said input capacitor; and
   (c) an output charge storage means spanning said series connected diodes such that one terminal of said charge storage means joins the anode of the second said diode to circuit common.

4. The circuit of claim 3, wherein said charge storage means is an RC parallel network having a selectable time constant.

* * * * *